United States Patent
Park et al.

(10) Patent No.: US 11,107,511 B2
(45) Date of Patent: Aug. 31, 2021

(54) CONTENT ADDRESSABLE MEMORY DEVICE WITH CHARGE SHARING BASED SELECTIVE MATCH LINE PRECHARGING SCHEME

(71) Applicant: Korea University Research and Business Foundation, Seoul (KR)

(72) Inventors: Jongsun Park, Seoul (KR); Woong Choi, Bucheon-si (KR); Geon Ko, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/903,972

(22) Filed: Jun. 17, 2020

(65) Prior Publication Data

US 2020/0402552 A1    Dec. 24, 2020

(30) Foreign Application Priority Data

Jun. 18, 2019 (KR) .................. 10-2019-0071958

(51) Int. Cl.
*G11C 7/10* (2006.01)
*G11C 7/06* (2006.01)
*G11C 15/04* (2006.01)

(52) U.S. Cl.
CPC ............ *G11C 7/1048* (2013.01); *G11C 7/065* (2013.01); *G11C 7/106* (2013.01); *G11C 7/1087* (2013.01); *G11C 15/04* (2013.01)

(58) Field of Classification Search
CPC ....... G11C 7/1048; G11C 7/065; G11C 7/106; G11C 7/1087; G11C 15/04

USPC ................. 365/203, 49, 204, 230.08, 189.07
See application file for complete search history.

(56) References Cited

U.S. PATENT DOCUMENTS

| 6,317,349 B1 * | 11/2001 | Wong .................. G11C 15/046 365/185.05 |
| 6,343,029 B1 | 1/2002 | Kengeri et al. |
| 9,672,912 B2 | 6/2017 | Matsuoka et al. |
| 2004/0223353 A1 * | 11/2004 | Kim ...................... H01L 27/11 365/49.15 |
| 2006/0098468 A1 * | 5/2006 | Park ....................... G11C 15/04 365/49.17 |

FOREIGN PATENT DOCUMENTS

KR    10-2001-0004110 A    1/2001

* cited by examiner

*Primary Examiner* — Connie C Yoha

(74) *Attorney, Agent, or Firm* — NSIP Law

(57) ABSTRACT

A CAM device includes a cell array including a plurality of CAM cells, a search line driving circuit connected to the cell array through a plurality of search lines, and a match line sensing circuit connected to the cell array through a plurality of match lines. Each of the CAM cells includes a first half CAM cell connected to a first match line and a second half CAM cell connected to a second match line different from the first match line. The first match line connected to the first half CAM cell is precharged in a first phase, and the second match line connected to the second half CAM cell is precharged in a second phase after the first phase. Thus, power consumption of the CAM device is reduced and delay is minimized.

15 Claims, 19 Drawing Sheets

CONTENT ADDRESSABLE MEMORY DEVICE WITH CHARGE SHARING BASED SELECTIVE MATCH LINE PRECHARGING SCHEME

CROSS-REFERENCE TO RELATED APPLICATION

This U.S. non-provisional patent application claims priority under 35 U.S.C. § 119 of Korean Patent Application No. 10-2019-0071958, filed on Jun. 18, 2019, the contents of which are hereby incorporated by reference in its entirety.

BACKGROUND

1. Field of Disclosure

Embodiments of the present disclosure relate to a content addressable memory (CAM).

2. Description of the Related Art

A content addressable memory (CAM) is a high-speed search engine widely used in network routers and many related computing applications. The CAM that is the high-speed search engine quickly searches an address of data stored in a memory.

SUMMARY

The present disclosure provides a content addressable memory device capable of reducing a power consumption and minimizing a delay in discharge.

Embodiments of the inventive concept provide a CAM device including a cell array including a plurality of CAM cells, a search line driving circuit connected to the cell array through a plurality of search lines, and a match line sensing circuit connected to the cell array through a plurality of match lines. Each of the CAM cells includes a first half CAM cell connected to a first match line and a second half CAM cell connected to a second match line different from the first match line. The first match line connected to the first half CAM cell is precharged in a first phase, and the second match line connected to the second half CAM cell is precharged in a second phase after the first phase.

The first half CAM cell and the second half CAM cell share a latch that stores data.

The match line sensing circuit includes a precharge unit precharging the first match line and a charge sharing unit connected between the first match line and the second match line, and the charge sharing unit performs a charge sharing operation between the first match line and the second match line after a sensing operation is performed on the first match line.

Data of the CAM cells connected to the first match line are mismatched with search data corresponding to the first match line.

The match line sensing circuit includes a precharge unit precharging the first match line, a first charge sharing unit connected between the first match line and the second match line, and a second charge sharing unit connected between the first match line and a bit line.

The match line sensing circuit further includes a sensing unit electrically connected to the first match line and the second match line and performing a first sensing operation on the first match line and a second sensing operation on the second match line.

The bit line is connected to the first half CAM cell, the first charge sharing unit performs a first charge sharing operation between the first match line and the second match line after the first sensing operation is performed, and the second charge sharing unit performs a second charge sharing operation between the first match line and the bit line after the second sensing operation is performed.

The second sensing operation is performed after the first sensing operation is performed.

A voltage level of the bit line after the second charge sharing operation is performed is smaller than a voltage level of the first match line after the first charge sharing operation is performed.

The precharge unit includes a first transistor connected to the first match line and precharging the first match line in response to a first control signal and a second transistor connected to the second match line and discharging the second match line in response to a second control signal different from the first control signal.

The CAM device further includes a search data input circuit connected to the search line driving circuit and transmitting search data applied thereto from an outside to the search line driving circuit through a transmission line.

Each of the first half CAM cell and the second half CAM cell is a NAND type CAM cell.

According to the above, the CAM device may reduce the power consumption and may minimize the delay.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Hereinafter, exemplary embodiments of the present disclosure will be explained in detail with reference to the accompanying drawings in order to describe in detail the inventive concept of the present application so that those skilled in the art of the present disclosure easily implements the inventive concept.

Figure 1:
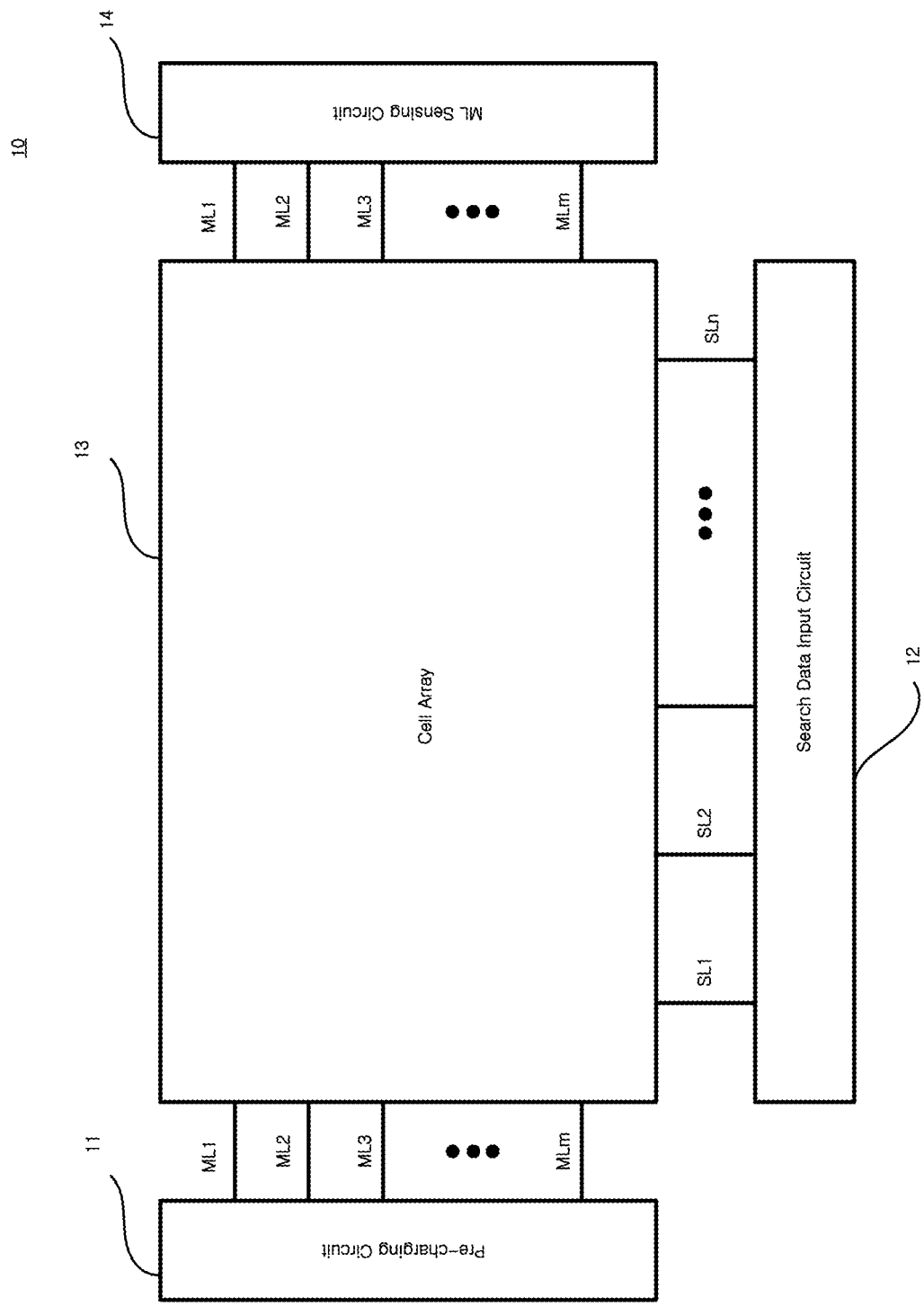
FIG. 1 is a block diagram showing a content addressable memory (CAM) device according to an exemplary embodiment of the present disclosure.

FIG. 1 is a block diagram showing a content addressable memory (CAM) device 10 according to an exemplary embodiment of the present disclosure. Referring to FIG. 1, the CAM device 10 includes a pre-charging circuit 11, a search data input circuit 12, a cell array 13, and a match line sensing circuit 14.

The pre-charging circuit 11 is connected to the cell array 13 through match lines ML1 to MLm. During a search operation of the CAM device 10, the pre-charging circuit 11 performs an operation to precharge the match lines ML1 to MLm to a predetermined voltage level.

The search data input circuit 12 is connected to the cell array 13 through search lines SL1 to SLn. The search data input circuit 12 receives search data, which are to be searched, from the outside. During the search operation of the CAM device 10, the search data input circuit 12 drives the search data, which are to be searched, to the search lines SL1 to SLn.

The cell array 13 includes a plurality of CAM cells. For example, each of the CAM cells may be implemented by a NOR type CAM cell or a NAND type CAM cell. As another example, some CAM cells of the CAM cells may be implemented by the NOR type CAM cell, and the other CAM cells of the CAM cells may be implemented by the NAND type CAM cell.

In addition, each of the CAM cells may be implemented by one of a binary CAM cell or a ternary CAM cell. The binary CAM cell may store, for example, "1" and "0". The ternary CAM cell may store, for example, "1", "0", and "don't care bit".

The match line sensing circuit 14 is connected to the cell array 13 through the match lines ML1 to MLm. The match line sensing circuit 14 may include at least one sense amplifier. During the search operation of the CAM device 10, it may be determined whether a data stored in the CAM cells are matched a the search data based on a voltage level of the match line according to whether the match line is discharged, and an address of matching data may be output.

FIGS. 2 to 5 are circuit diagrams showing the search operation of the CAM device 10 of FIG. 1. For the convenience of explanation, a first match line ML1 and the CAM cells corresponding to the first match line ML1 are shown as a representative example.

Figure 3:
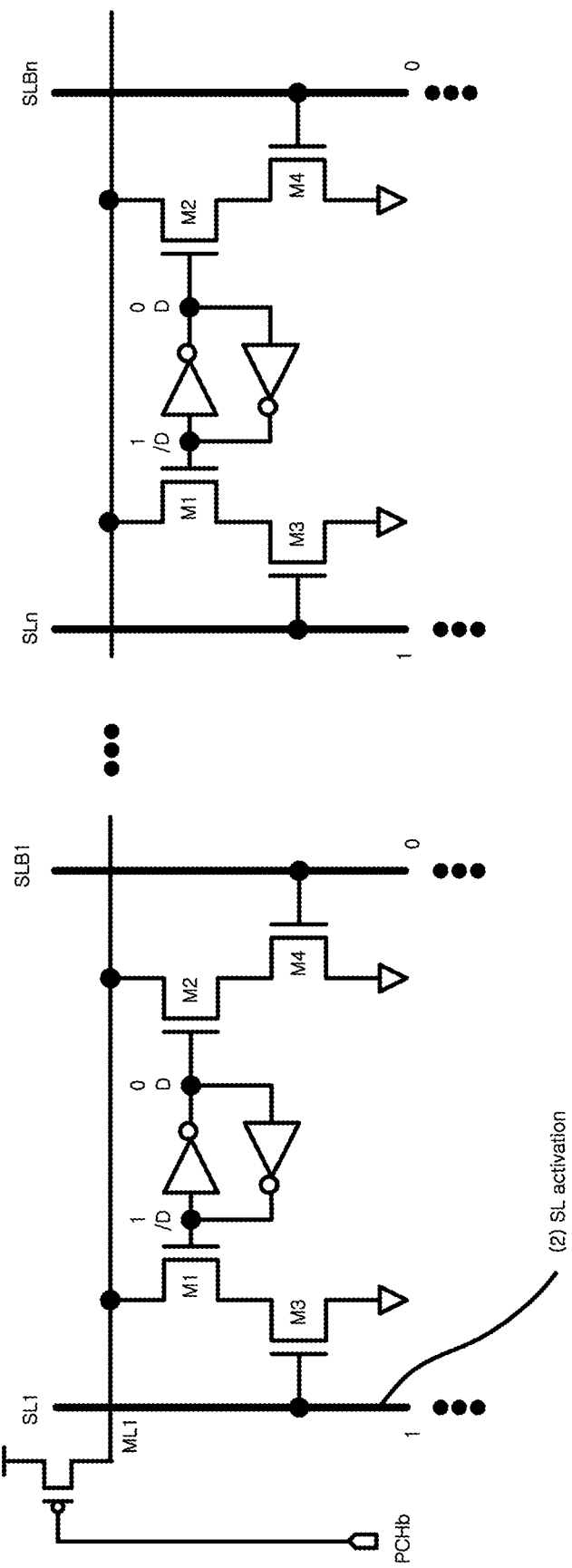

Referring to FIG. 3, the first match line ML1 is precharged. That is, the first match line ML1 is precharged to a Vdd voltage level by the pre-charging circuit 11.

Referring to FIG. 3, the search lines SL1 to SLn and complementary search lines SLB1 to SLBn are driven. That is, the search data input circuit 11 drives the search lines SL1 to SLn and the complementary search lines SLB1 to SLBn based on the search data that are to be searched.

Figure 2:
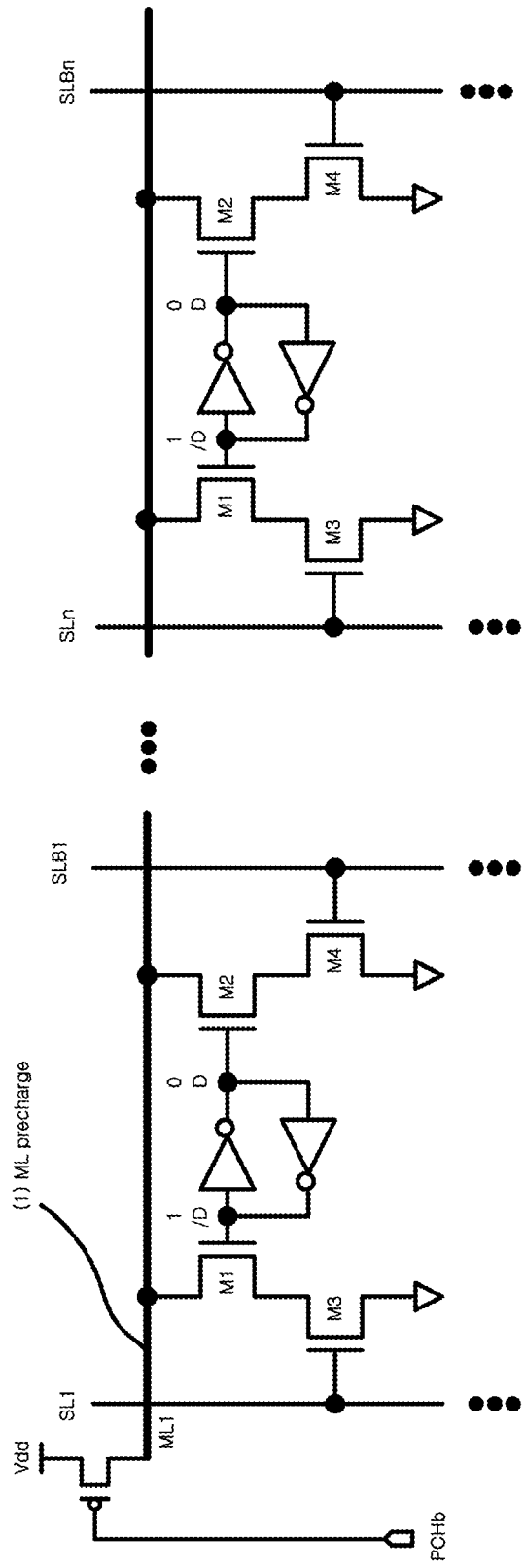
FIGS. 2 to 5 are circuit diagrams showing a search operation of the CAM device of FIG. 1.

For example, when assuming that each of the search data is "1", a voltage of a logic high level (H) corresponding to the data of "1" is provided to a first search line SL1 to an n-th search line SLn, and a voltage of a logic low level (L) corresponding to the data of "0" is provided to a first complementary search line SLB1 to an n-th complementary search line SLBn as shown in FIG. 2.

Figure 4:
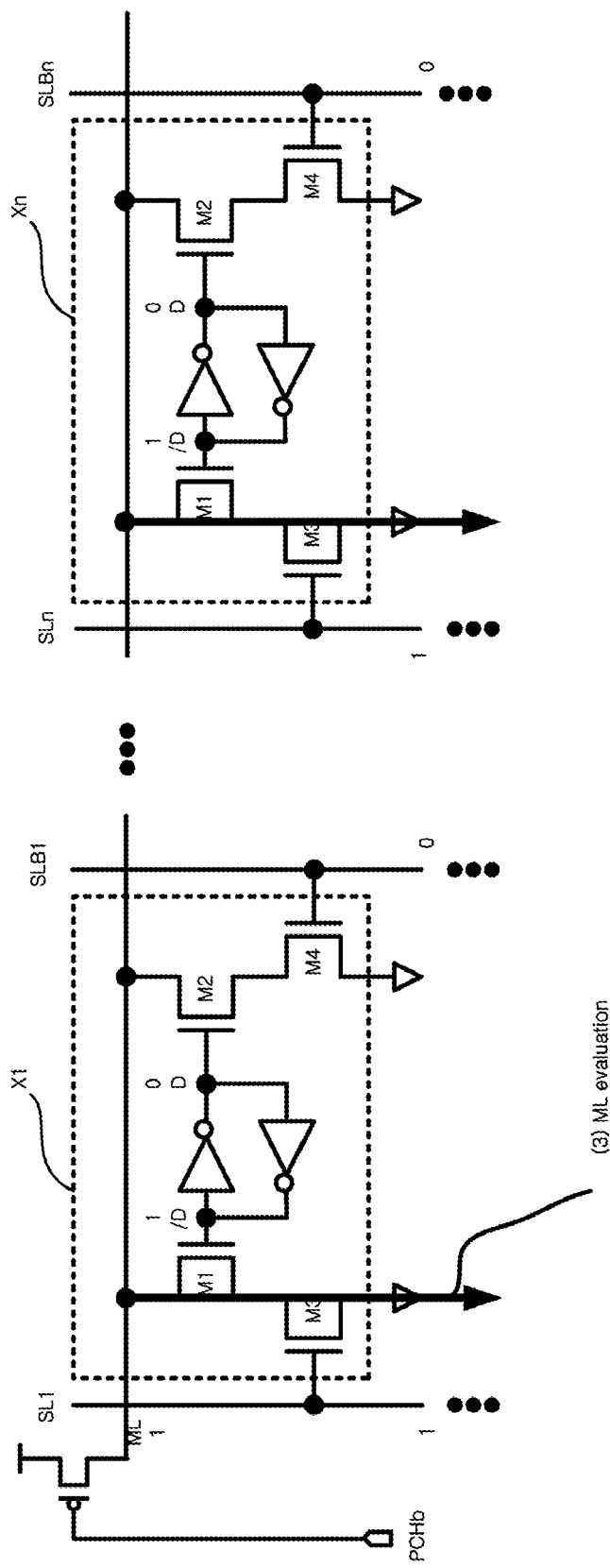

Referring to FIG. 4, an evaluation operation is performed on the first match line ML1. That is, as the CAM cells connected to the first match line ML1 are turned on or turned off, an operation of generating or blocking a discharge path for the first match line ML1 is performed.

For example, as shown in FIG. 4, in the case where each of the search data corresponding to the first to n-th search lines SL1 to SLn is "1", a third NMOS transistor M3 of a first CAM cell X1 is turned on. In addition, since the data stored in the first CAM cell X1 is "1", a first NMOS transistor M1 is also turned on. Accordingly, the discharge path is generated by the first and third NMOS transistors M1 and M3 of the first CAM cell X1, and the first match line ML1 is discharged.

Similarly, since the data stored in an the n-th CAM cell Xn is "1", the discharge path is generated by first and third NMOS transistors M1 and M3 of the n-th CAM cell Xn.

As described above, when any of the data stored in the CAM cells connected to the match line dose not match with the search data (i.e., if even one of the data is mismatched), the match line is discharged.

On the contrary, when all the data stored in the CAM cells connected to the match line are matched with the search data (i.e., all data are matched), the match line is not discharged.

Figure 5:
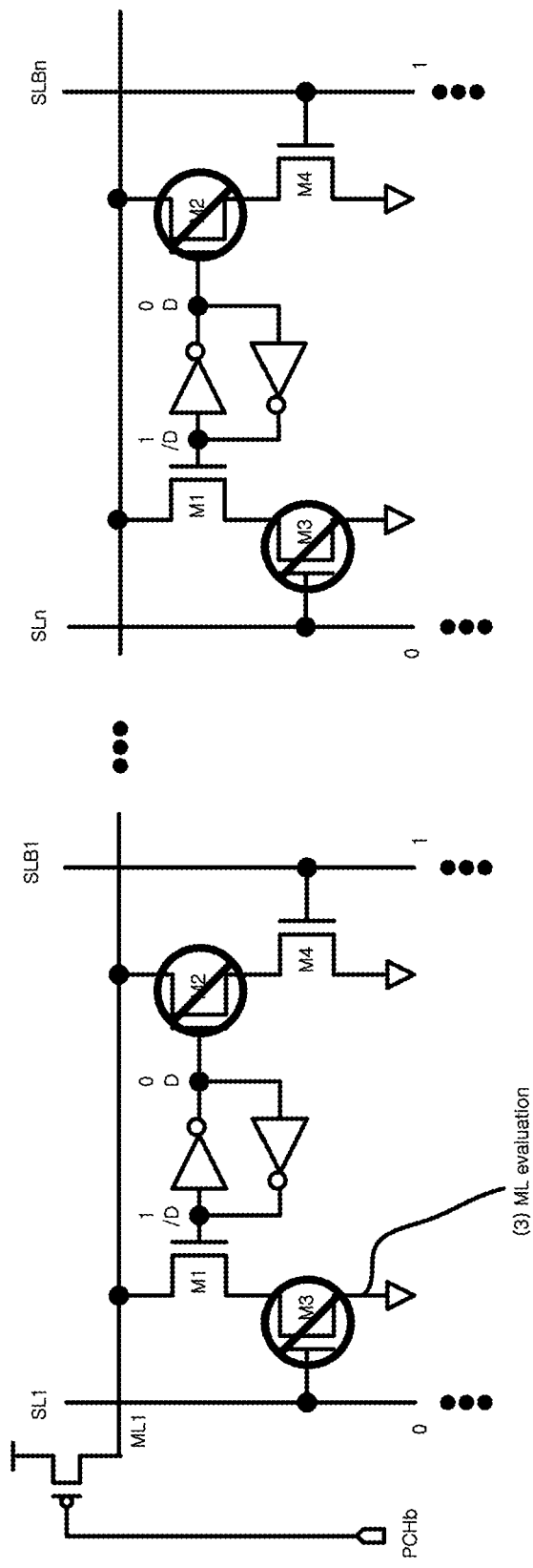

For example, as shown in FIG. 5, when assuming that each of the data corresponding to the first to n-th search lines SL1 to SLn is "0", the third NMOS transistor M3 of the first CAM cell X1 is turned off. In addition, since the data of "0" is stored in the first CAM cell X1, a second NMOS transistor M2 is also turned off. Accordingly, the discharge path for the first match line ML1 is blocked.

Similarly, since the data stored in the n-th CAM cell Xn is "0", the discharge path is blocked by the n-th CAM cell Xn. As described above, since the discharge path is blocked when the data stored in the CAM cells are the same as the search data (i.e., all data are matched), the first match line ML1 is not discharged.

As described above, the match line is precharged and the data are loaded to the search lines by the search operation of the CAM device 10 of FIG. 1. When all the data of the CAM cells are the same as the search data, the voltage of the match line ML is maintained, and when any of the data of the CAM cells is different from the search data, the match line ML is discharged.

However, since the CAM device 10 of FIG. 1 includes many CAM cells connected to the match line and the search line, there is a large parasitic capacitance, resulting in very high power consumption. In addition, in the case of the worst mismatch (i.e., only one of the data is mismatched), the discharge of the match line is delayed.

Hereinafter, the CAM device that is capable of reducing the power consumption and quickly discharging the match line will be described in more detail.

Figure 6:
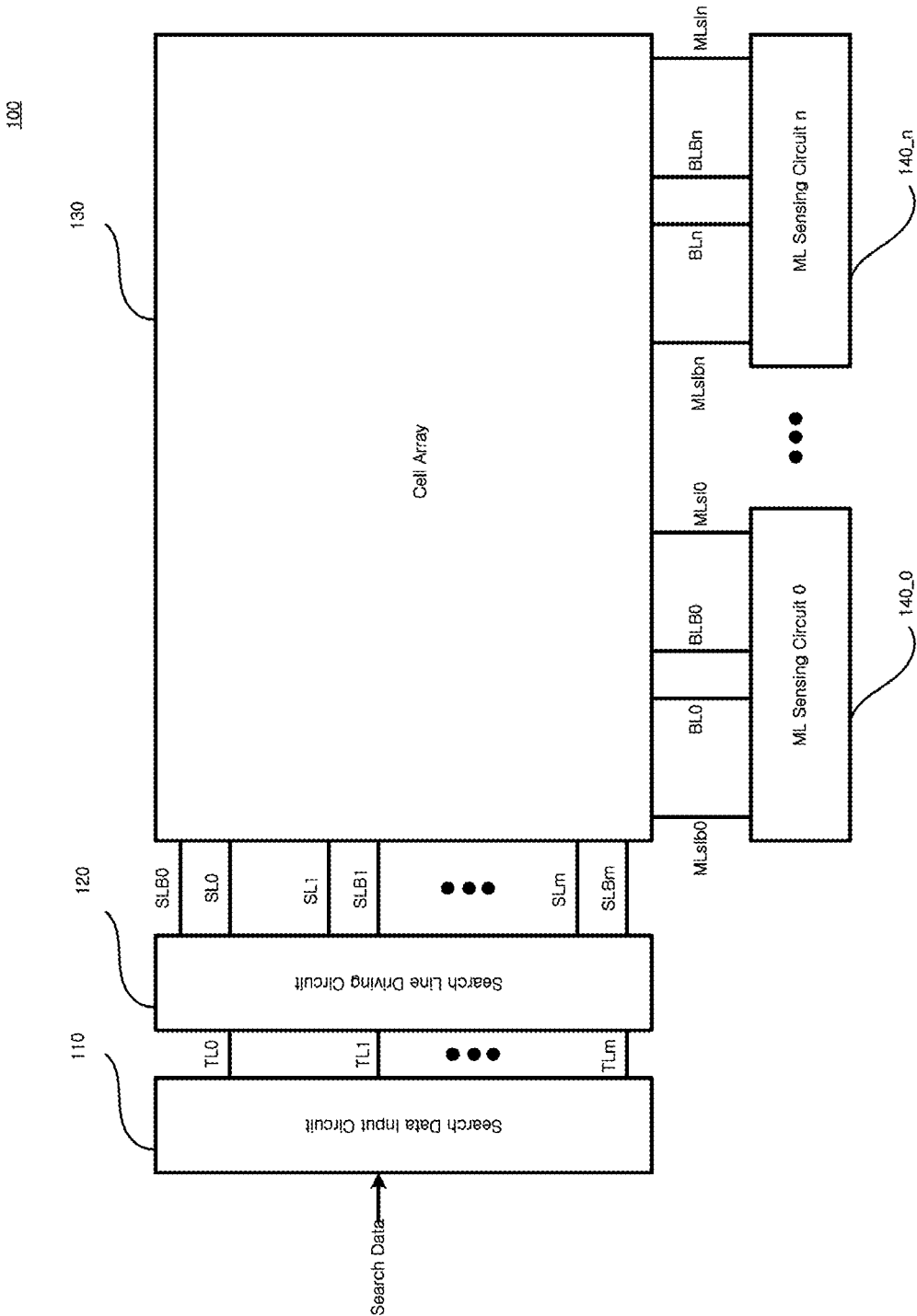
FIG. 6 is a block diagram showing a CAM device according to an exemplary embodiment of the present disclosure.

FIG. 6 is a block diagram showing a CAM device 100 according to an exemplary embodiment of the present disclosure.

Referring to FIG. 6, the CAM device 100 includes a search data input circuit 110, a search line driving circuit 120, a cell array 130, and at least one match line sensing circuit 140_0 to 140_n.

The search data input circuit Ho receives search data from the outside. The search data input circuit 110 transmits search data in parallel through a plurality of transmission lines TL0 to TLm. For example, when the search data (1, 1, . . . , 0) are input from the outside, the search data input circuit Ho transmits the data of "1" through the transmission line TL0, transmits the data of "1" through the transmission line TL1, and transmits the data of "0" through the transmission line TLm.

The search data input circuit 110 may be implemented to temporarily store the search data applied thereto from the outside. For example, the search data input circuit 110 may be implemented by a search data latch. In addition, the search data input circuit 110 may be implemented to drive a word line of a CAM cell of the cell array 130.

The search line driving circuit 120 receives the search data through the transmission lines TL0 to TLm. The search line driving circuit 120 is connected to the cell array 130 through a plurality of search line pairs. For example, the search line pairs include a pair of search lines SLB0 and SL0, a pair of search lines SL1 and SLB1, a pair of search lines SL2 and SLB2, and the like.

The search line driving circuit 120 drives the search line and a complementary search line based on corresponding search data. For example, when the data of "1" are received through the transmission line TL0, the search line driving circuit 120 drives the search line SL0 to be a logic high level and drives the complementary search line SLB0 to be a logic low level.

The cell array 130 includes a plurality of CAM cells. For example, each of the CAM cells may be implemented by a NOR type CAM cell or a NAND type CAM cell. As another example, some CAM cells of the CAM cells may be implemented by the NOR type CAM cell, and the other CAM cells of the CAM cells may be implemented by the NAND type CAM cell.

In addition, each of the CAM cells may be implemented by one of a binary CAM cell or a ternary CAM cell. The binary CAM cell may store, for example, "1" and "0". The ternary CAM cell may store, for example, "1", "0", and "don't care bit".

In the exemplary embodiment according to the technical spirit of the present disclosure, one CAM cell may be implemented to include a first half CAM cell and a second half CAM cell. The first half CAM cell and the second half CAM cell may be connected to different match lines, respectively, and may have a structure that shares a latch for storing data.

Each of the match line sensing circuits 140_0 to 140_n is connected to the cell array 130 through match lines MLslb and MLsl and bit lines BLB and BL. Each of the match line sensing circuits 140_0 to 140_n determines whether the search data match the data stored in the CAM cell based on whether the match line is discharged.

In the exemplary embodiment according to the technical spirit of the present disclosure, each of the match line sensing circuits 140_0 to 140_n may be implemented to have a structure that shares the voltage of the precharged match line with another match line. In addition, each of the match line sensing circuits 140_0 to 140_n may be implemented to have a structure that shares the voltage of the precharged match line with a bit line.

Figure 7:
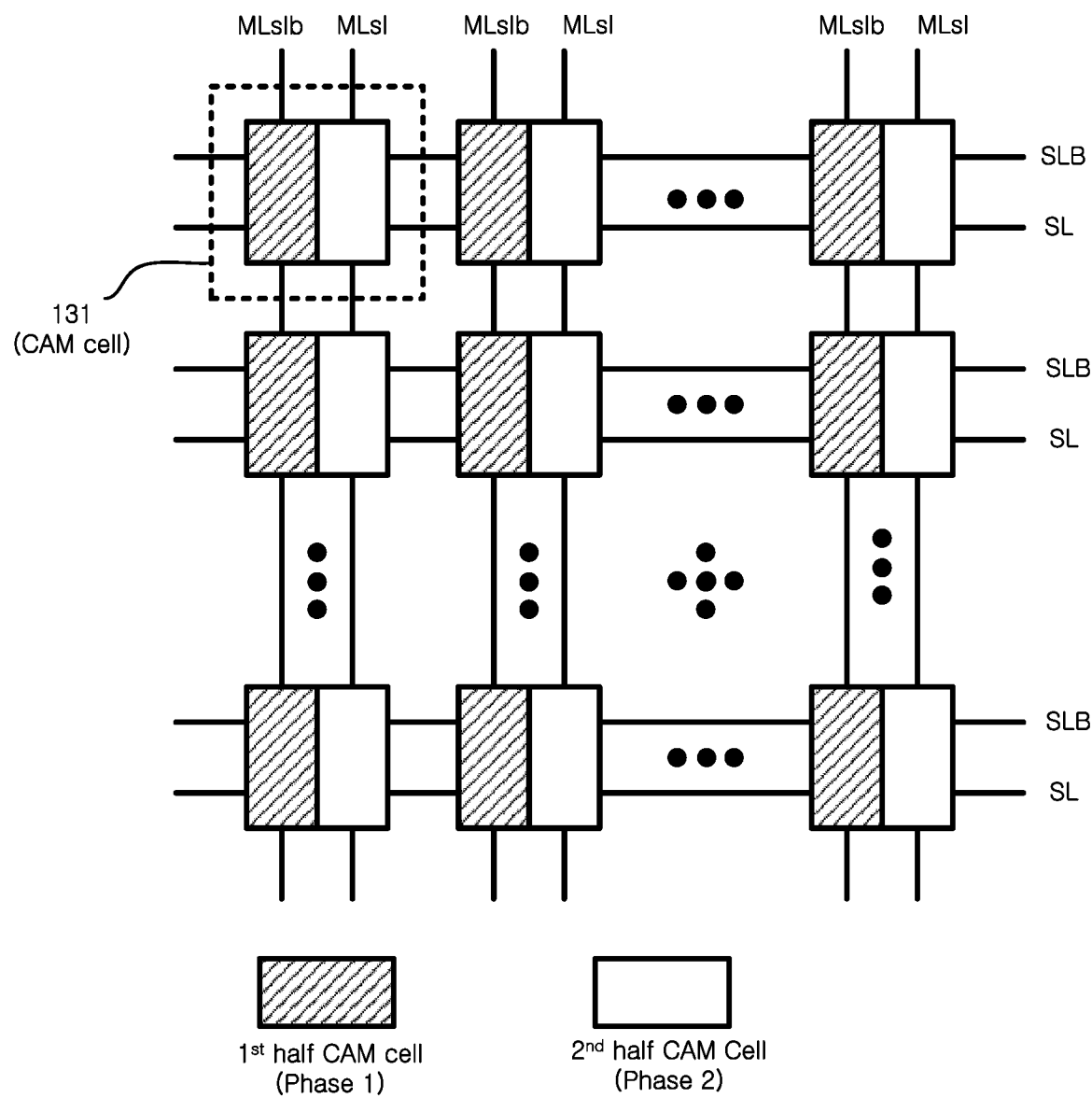
FIG. 7 is a view schematically showing a structure and an operation of CAM cells of the CAM device of FIG. 6.

FIG. 7 is a view schematically showing a structure and an operation of CAM cells 131 of the CAM device 100 of FIG. 6.

Referring to FIG. 7, each of the CAM cells 131 includes the first half CAM cell and the second half CAM cell. The first half CAM cells are connected to a first match line MLslb and the second half CAM cells are connected to a second match line MLsl.

The match lines may be classified into first match lines MLslb and second match lines MLsl. The match lines MLslb and MLsl are arranged in a column direction, and the search lines SL and SLB are arranged in a row direction. In this case, the first match lines MLslb are used to determine only whether the cells storing the data of "1" are matched, and the second match lines MLsl are used to determine only whether the cells storing the data of "0" are matched.

The search operation may be divided into a first phase Phase 1 and a second phase Phase 2. In the first phase, only the first match lines MLslb may be precharged and whether the first match lines are matched may be determined. When some match lines of the first match lines MLslb are matched, the discharge path of the matched first match line is blocked, and thus, charges that are precharged may be maintained. Then, as the charges of the matched first match line are shared with charges of the second match line MLsl that is not precharged, the second match line MLsl may be precharged. After that, in the second phase, whether the second match line MLsl, which is precharged by the charge sharing operation, is matched may be determined.

As described with reference to FIGS. 6 and 7, the match line of the CAM device 100 according to the exemplary embodiment of the present disclosure is divided into the first match line MLslb and the second match line MLsl, and the search operation is divided into the first phase and the second phase. In addition, only the first match lines MLslb are selectively precharged in the first phase, and only the second match line MLsl corresponding to the matched first match line is selectively precharged in the second phase. As described above, as the match lines are selectively precharged, a switching capacitance of the match line is reduced, and thus, the power consumption is reduced.

Further, according to the CAM device 100 according to the exemplary embodiment of the present disclosure, the second match line MLsl is precharged by the charge sharing operation during the second phase. As described above, as the match lines are precharged to a low-level voltage through the charge sharing operation, the power consumption is reduced, and the delay of the match line is minimized.

Figure 8:
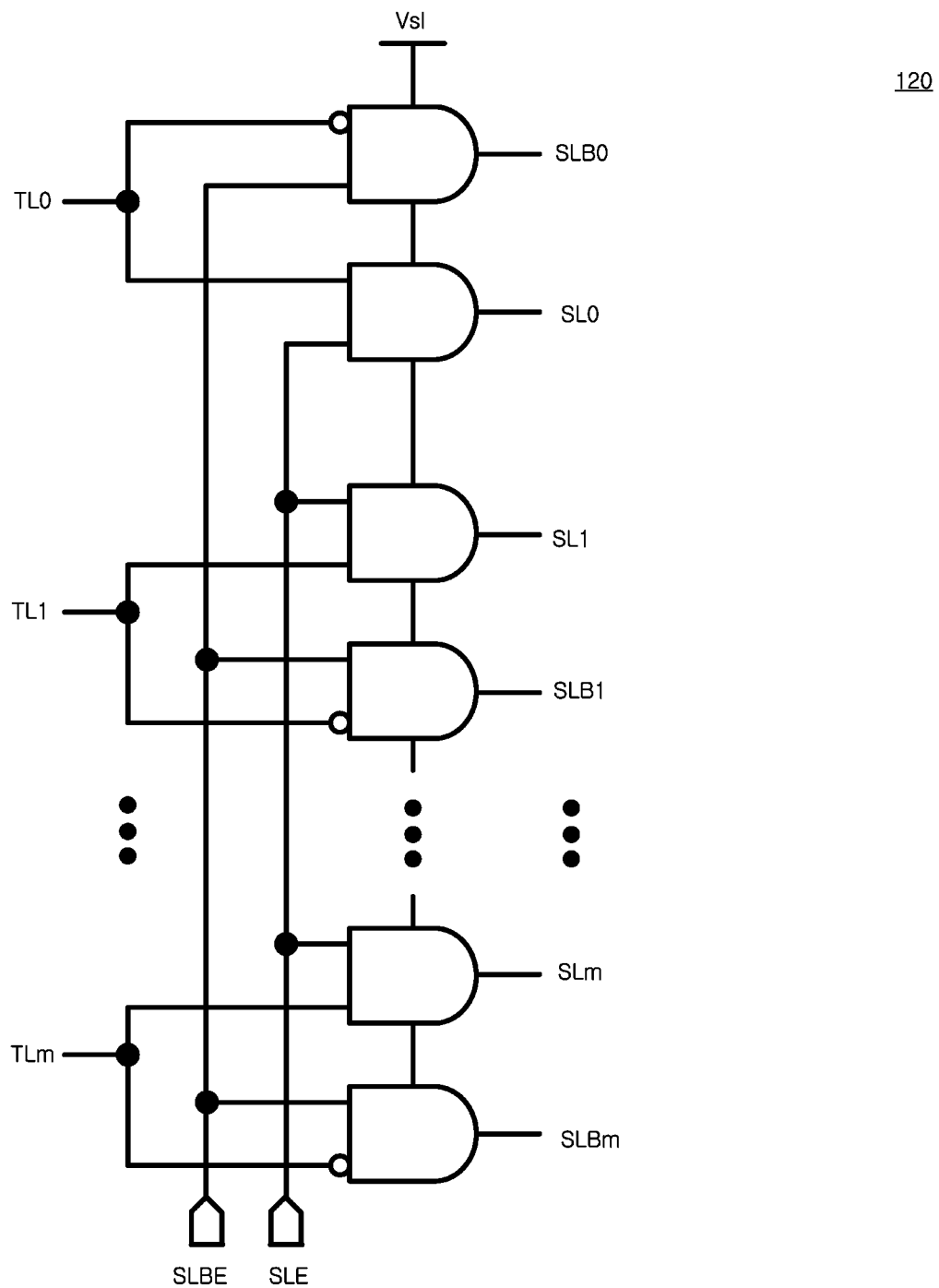
FIG. 8 is a circuit diagram showing an example of a search line driving circuit of the CAM device of FIG. 6.

FIG. 8 is a circuit diagram showing an example of the search line driving circuit 120 of the CAM device 100 of FIG. 6.

Referring to FIG. 8, the search data are provided to the transmission lines TL0 to TLm. Then, responsive to an SLB activation signal (hereinafter, referred to as "SLBE signal") and/or an SL activation signal (hereinafter, referred to as "SLE signal"), the search data are provided in parallel to the search lines SL0 to SLm, and complementary search data are provided in parallel to complementary search lines SLB0 to SLBm.

Figure 9:
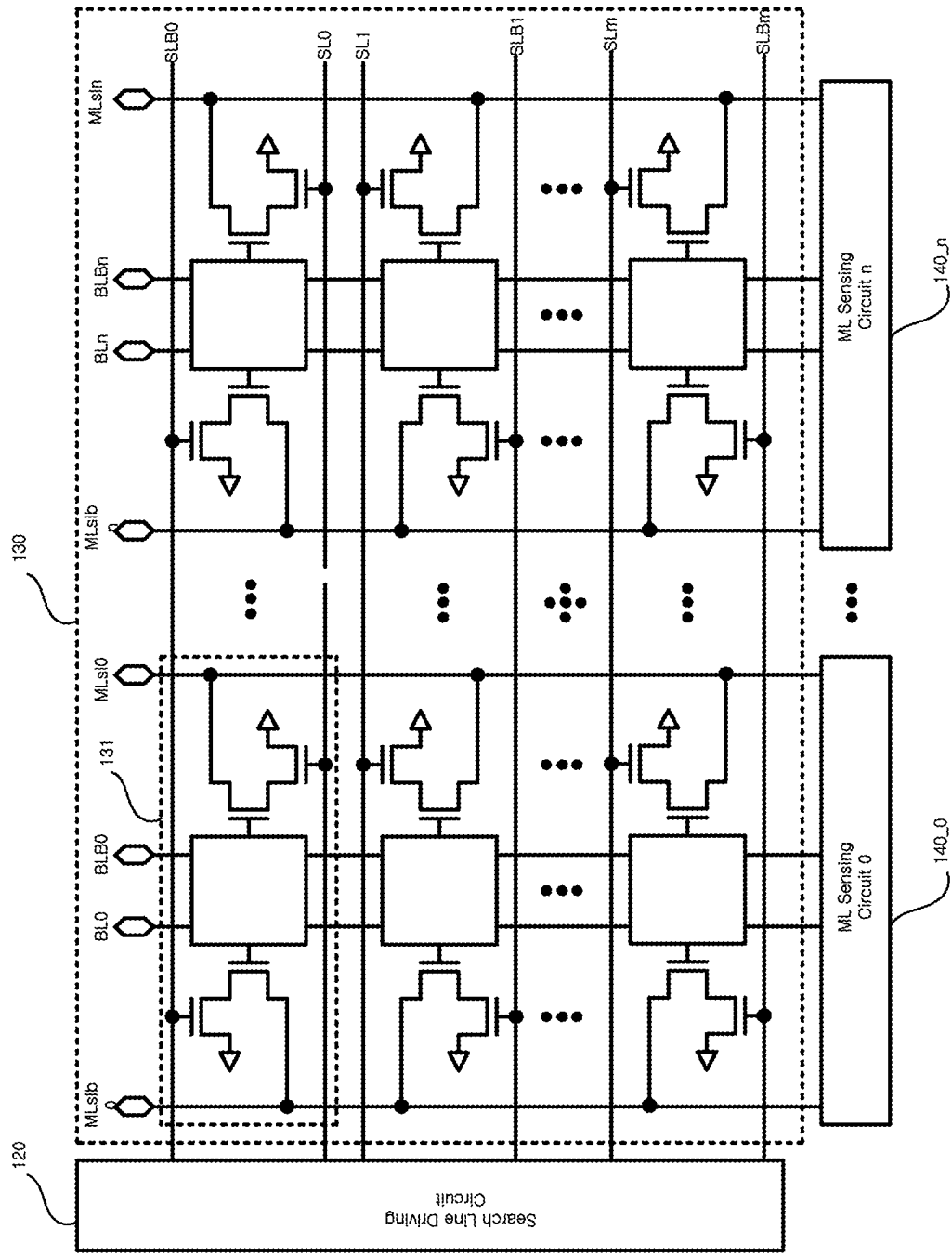
FIG. 9 is a circuit diagram showing a cell array of the CAM device of FIG. 6.
Figure 10:
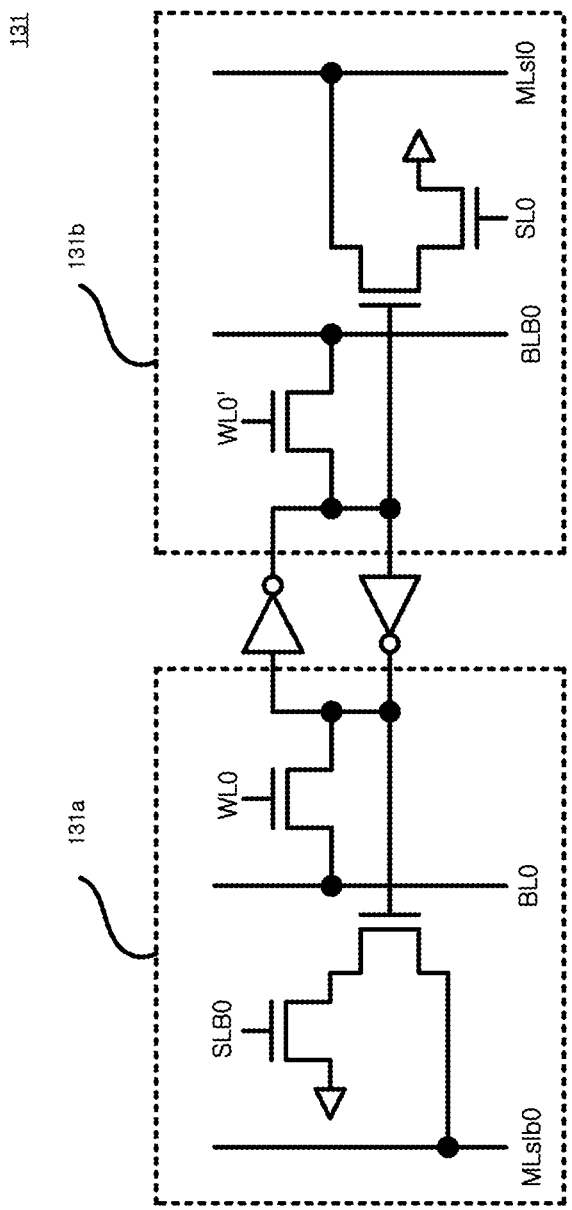
FIG. 10 is a circuit diagram showing a CAM cell of FIG. 9.

FIG. 9 is a circuit diagram showing the cell array 130 of the CAM device 100 of FIG. 6 in more detail, and FIG. 10 is a circuit diagram showing the CAM cell 131 of FIG. 9 in more detail.

Referring to FIGS. 9 and 10, the cell array 130 includes a plurality of CAM cells 131, and each of the CAM cells 131 includes the first half CAM cell 131a and the second half CAM cell 131b. The first half CAM cell 131a corresponds to the first match line MLslb and the bit line BL, and the second half CAM cell 131b corresponds to the second match line MLsl and a complementary bit line BLB.

The first half CAM cell 131a is implemented to include, for example, three NMOS transistors and one latch. The second half CAM cell 131b is implemented to include, for example, three NMOS transistors and one latch. In addition, the first half CAM cell 131a and the second half CAM cell 131b are implemented to share the latch for storing the data.

Figure 11:
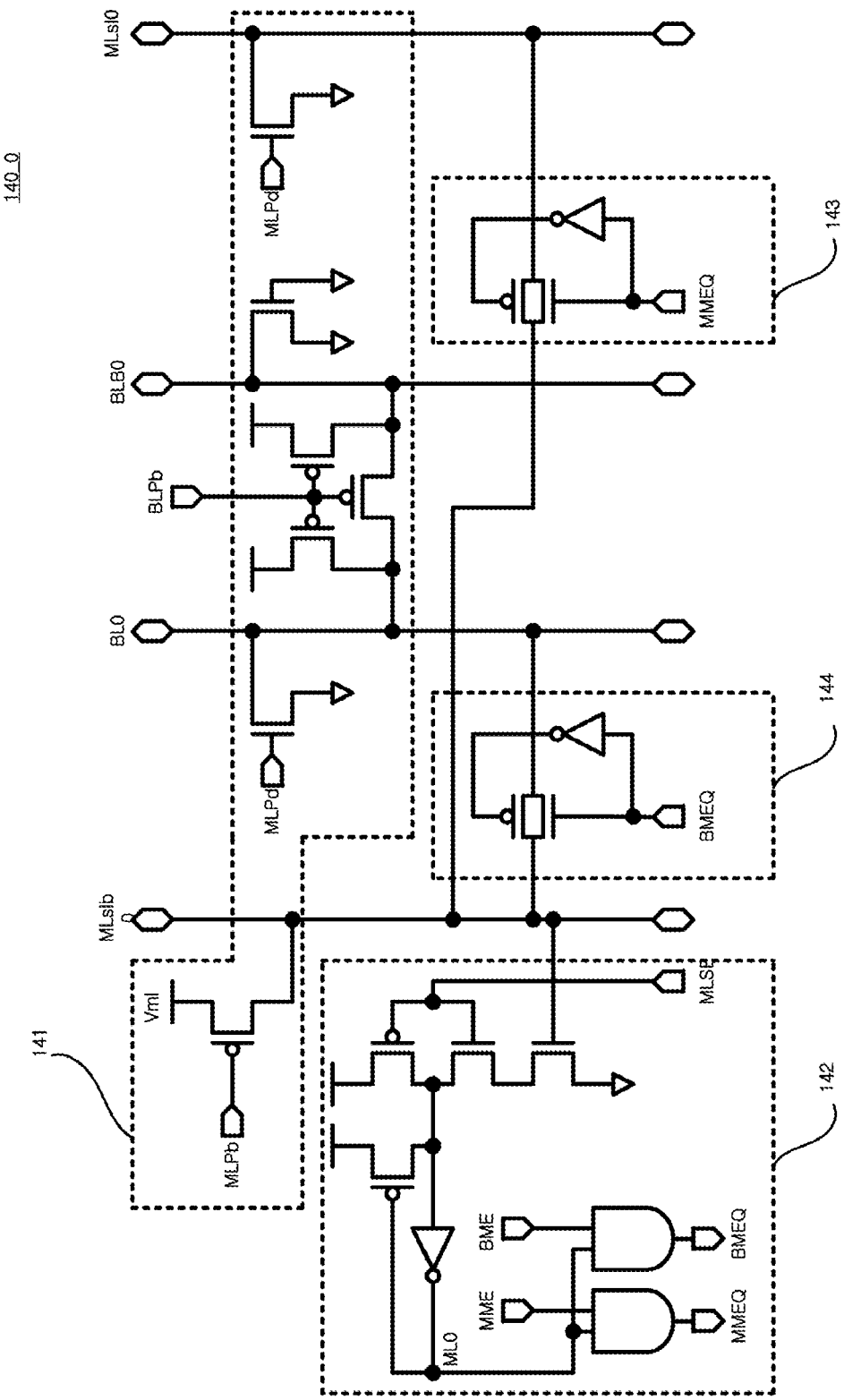
FIG. 11 is a circuit diagram showing an example of a match line sensing circuit of the CAM device of FIG. 6.

FIG. 11 is a circuit diagram showing an example of the match line sensing circuit 140_0 of the CAM device 100 of FIG. 6.

Referring to FIG. 11, the match line sensing circuit 140_0 includes a precharge unit 141, a sensing unit 142, a first charge sharing unit 143, and a second charge sharing unit 144.

The precharge unit 141 is implemented to precharge a first match line MLslb0. For example, the precharge unit 141 includes at least one PMOS transistor and precharges the first match line MLslb0 in response to a signal MLPb.

The precharge unit 141 is implemented to discharge a bit line BL0 and a second match line MLsl0. For example, the precharge unit 141 includes at least one NMOS transistor and discharges the bit line BL0 in response to a signal MLPd. For example, the precharge unit 141 includes at least one NMOS transistor and discharges the second match line MLsl0 in response to the signal MLPd.

The sensing unit 142 is implemented to determine whether the first match line MLslb0 and/or the second match line MLsl are discharged. For example, the sensing unit 142 includes at least two NMOS transistors, at least two PMOS transistors, an inverter, and at least two NAND gates. A gate of the transistor of the sensing unit 142 is connected to the first match line MLslb0. The gate of the transistor of the sensing unit 142 is connected to the second match line MLsl through the first charge sharing unit 143.

The first charge sharing unit 143 is implemented to allow a charge sharing operation to be performed between the first match line MLslb0 and the second match line MLsl0. For example, the first charge sharing unit 143 is connected between the first match line MLslb0 and the second match line MLsl0 and is implemented such that charges of the first match line MLslb0, which is precharged, move to the second match line MLsl0 in response to a signal MMEQ.

The second charge sharing unit 144 is implemented to allow a charge sharing operation to be performed between the first match line MLslb0 and the bit line BL0. For example, the second charge sharing unit 144 is connected between the first match line MLslb0 and the bit line BL0 and is implemented such that charges remaining in the first match line MLslb0 move to the bit line BL0 in response to a signal BMEQ.

Figure 12:
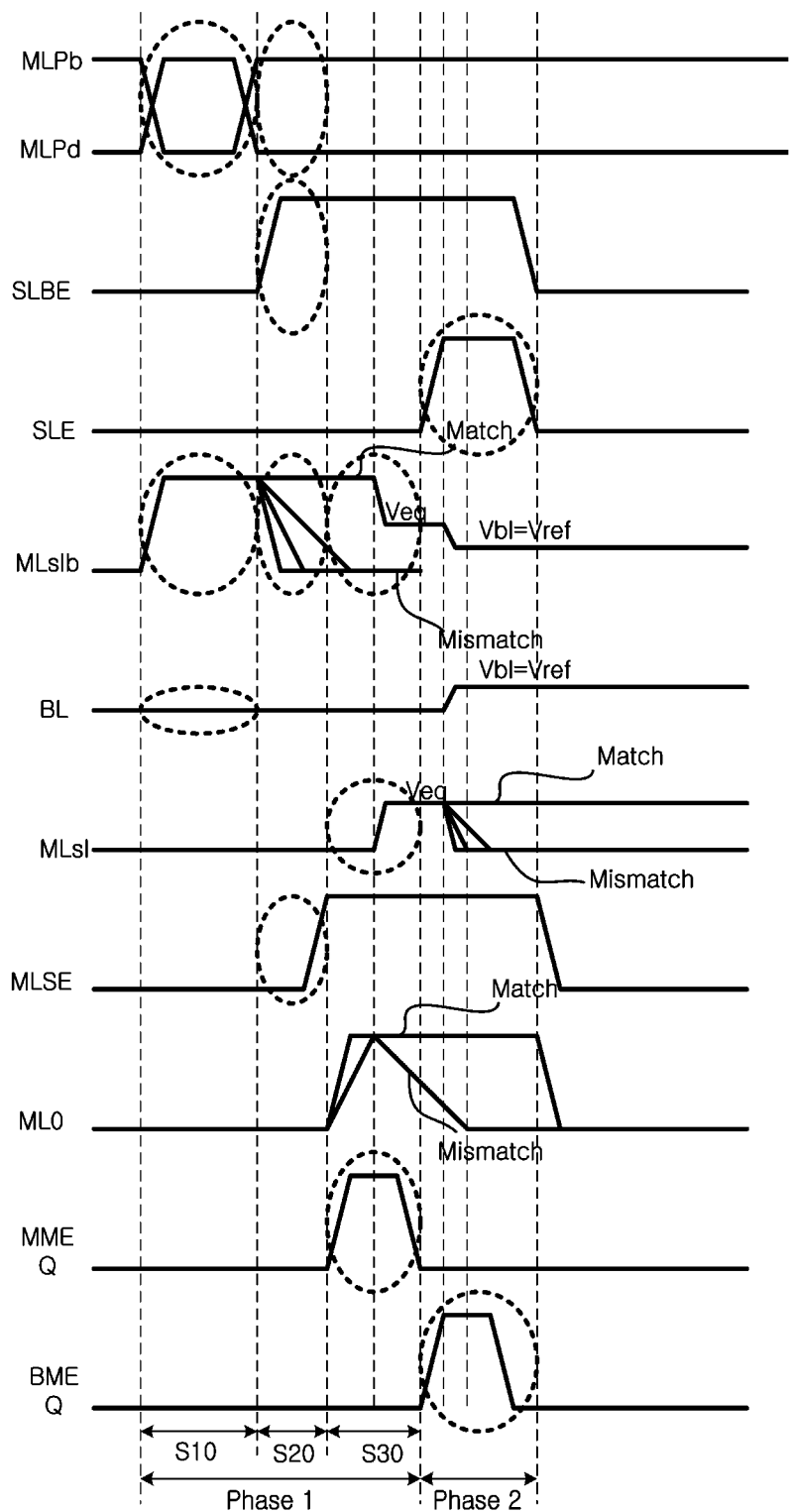
FIG. 12 is a timing diagram showing an operation of the CAM device of FIG. 6.
Figure 13A:
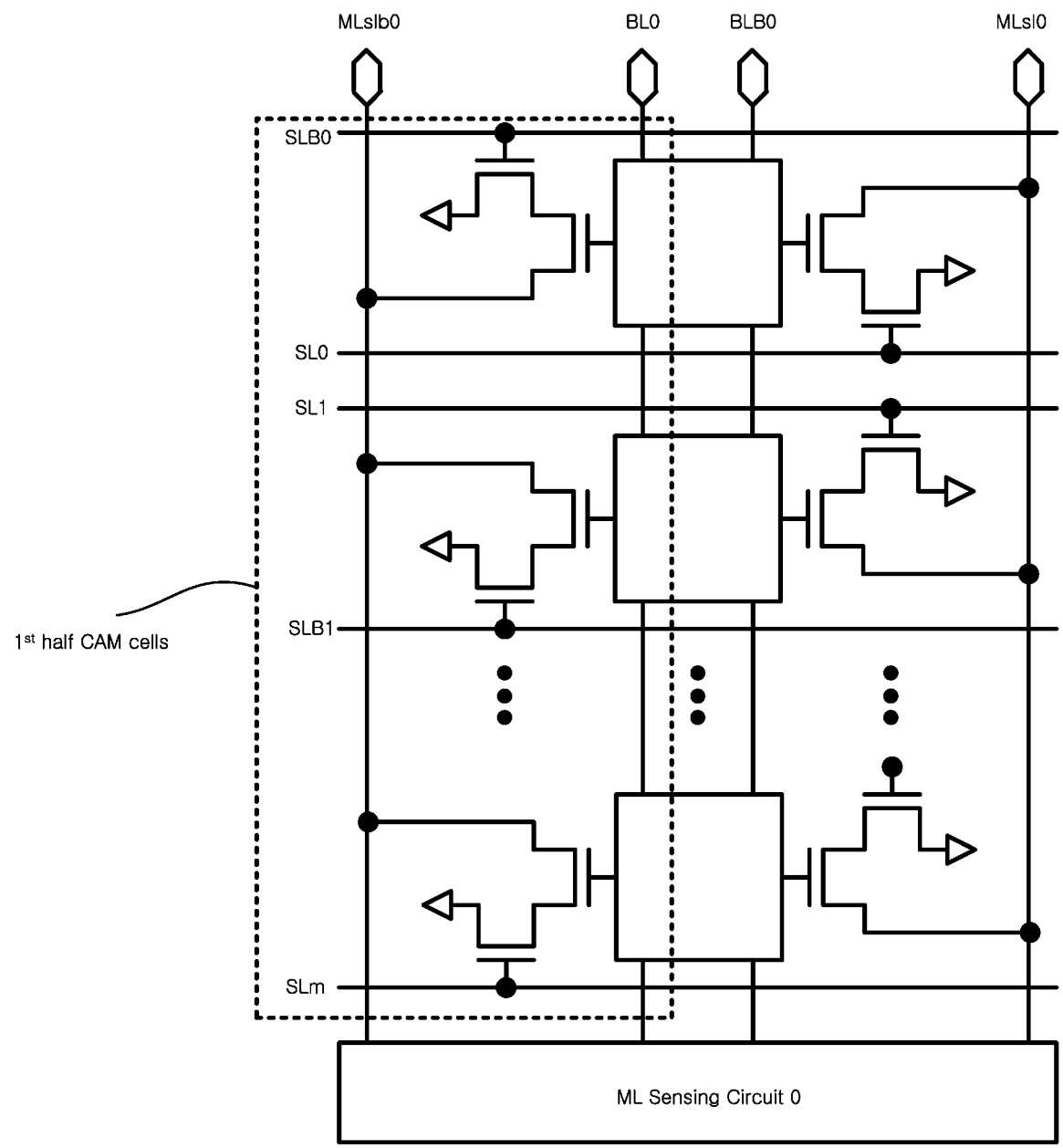
FIGS. 13A and 13B are circuit diagrams showing an operation of a first step of a first phase.
Figure 13B:
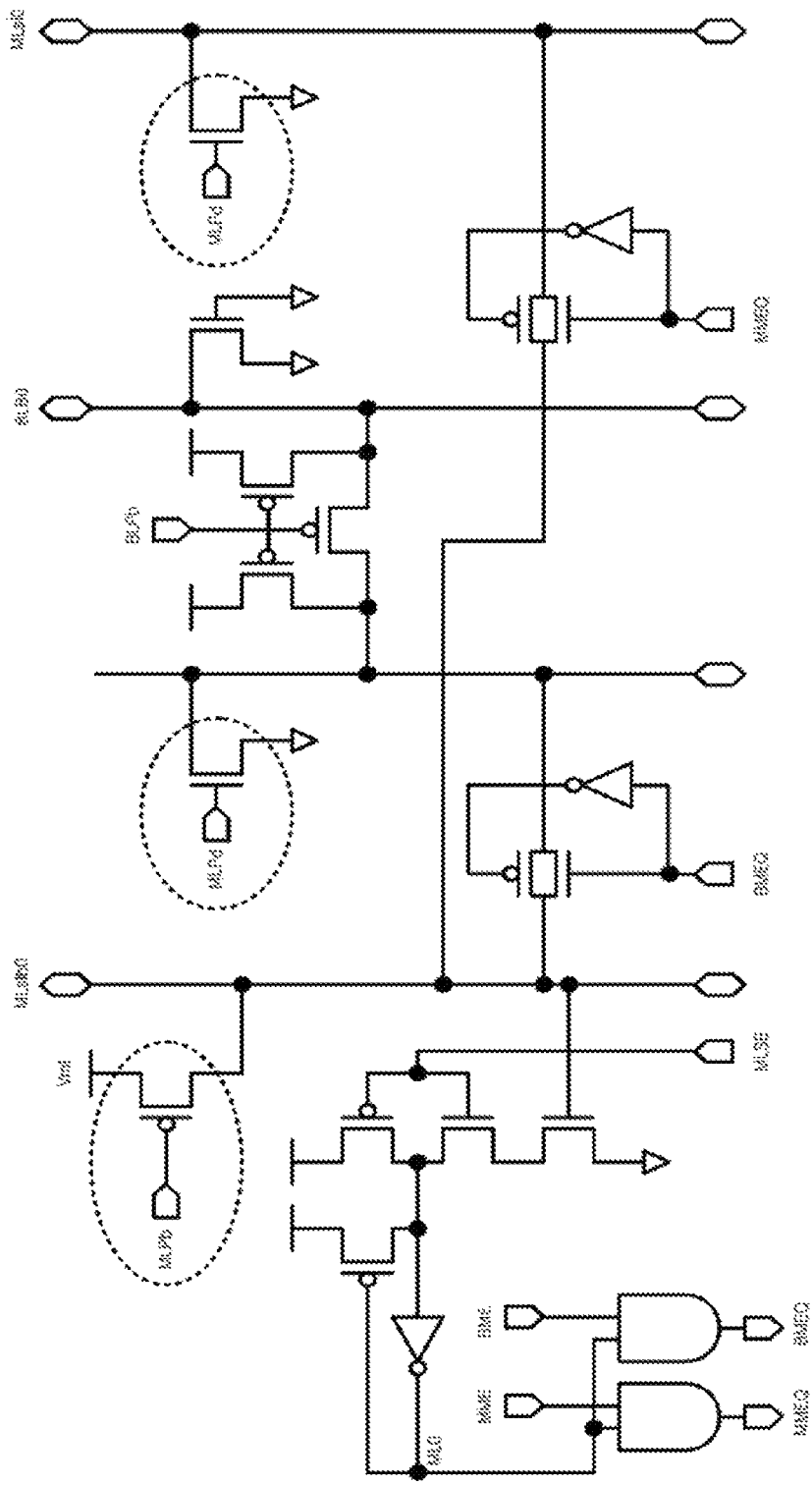
Figure 14A:
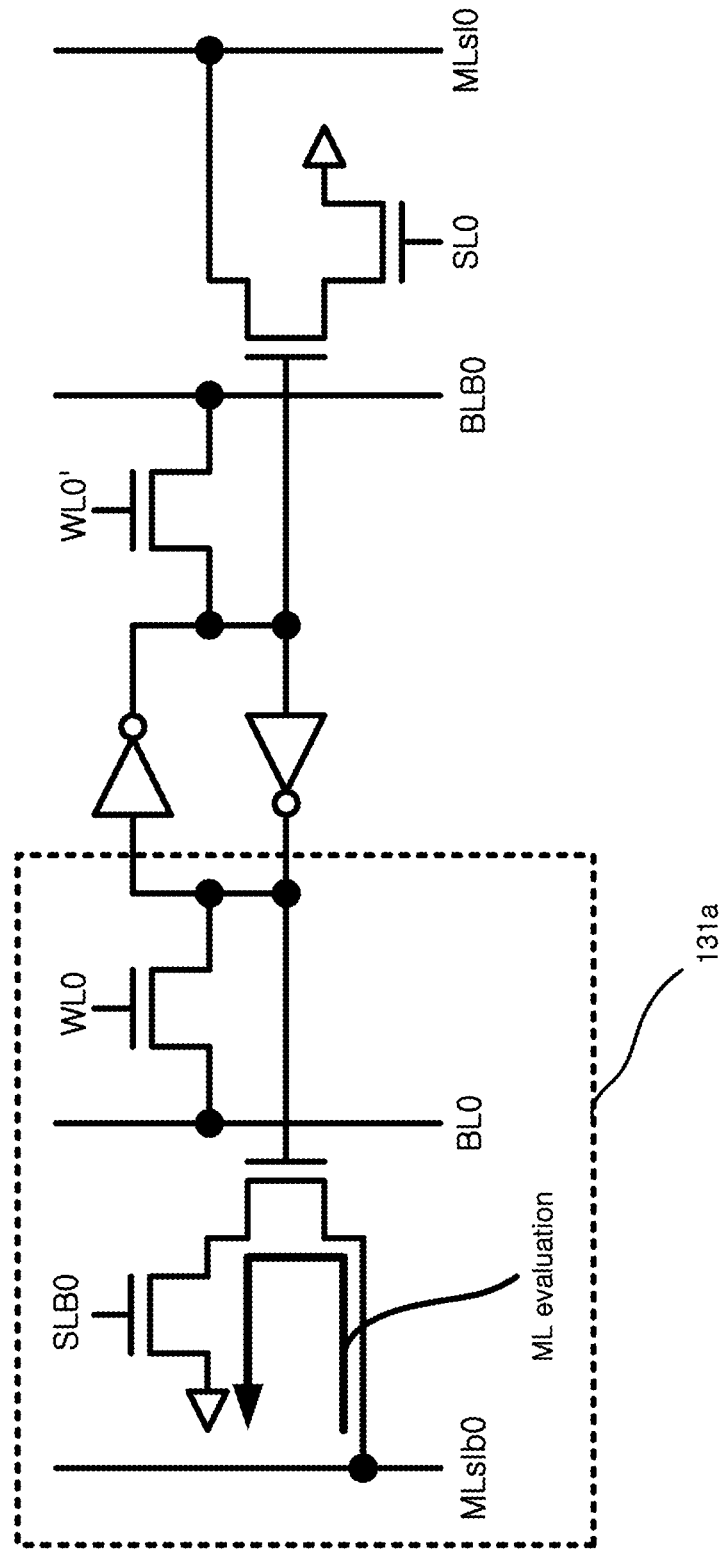
FIGS. 14A and 14B are circuit diagrams showing an operation of a second step of the first phase.
Figure 14B:
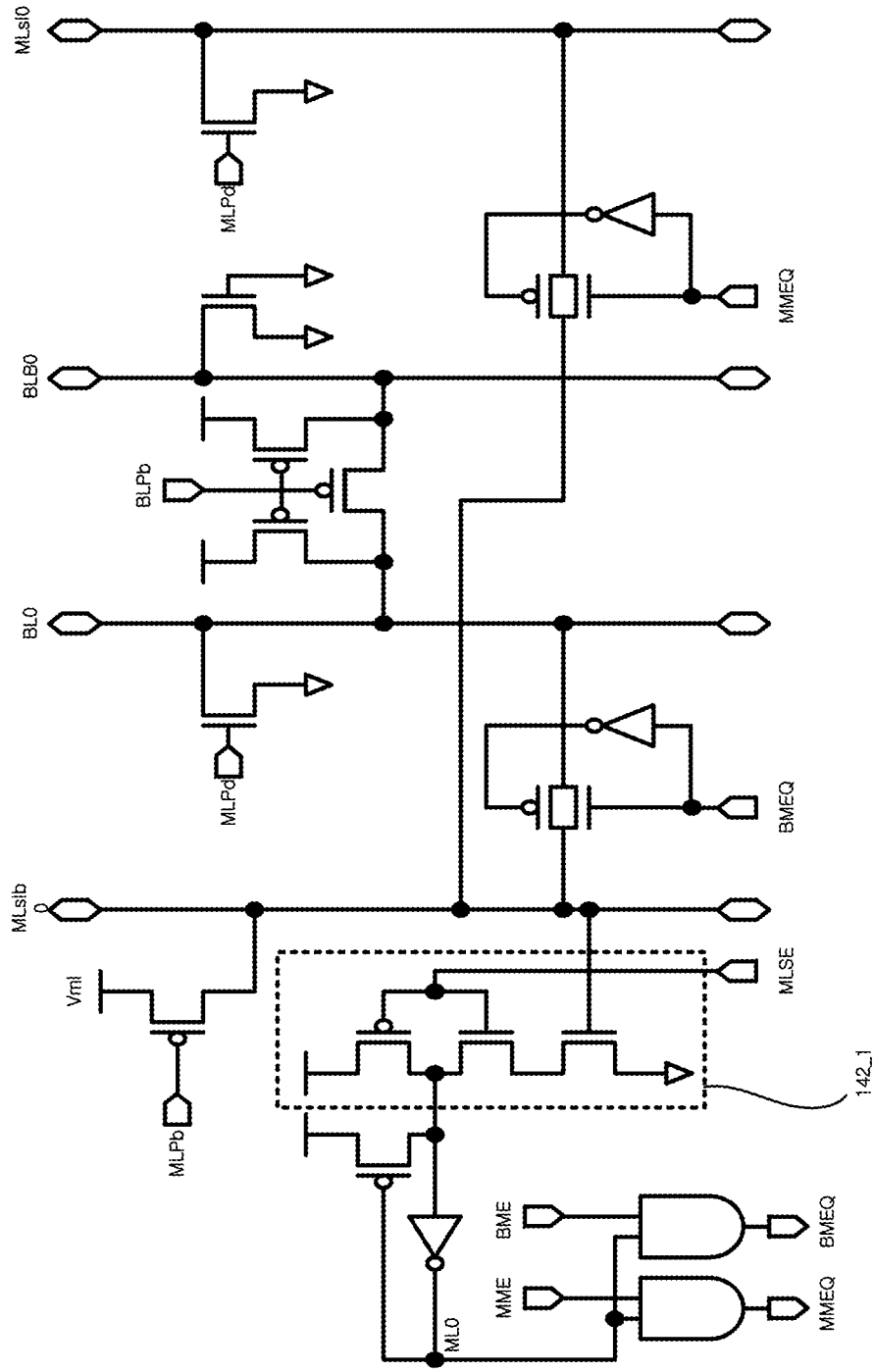
Figure 15:
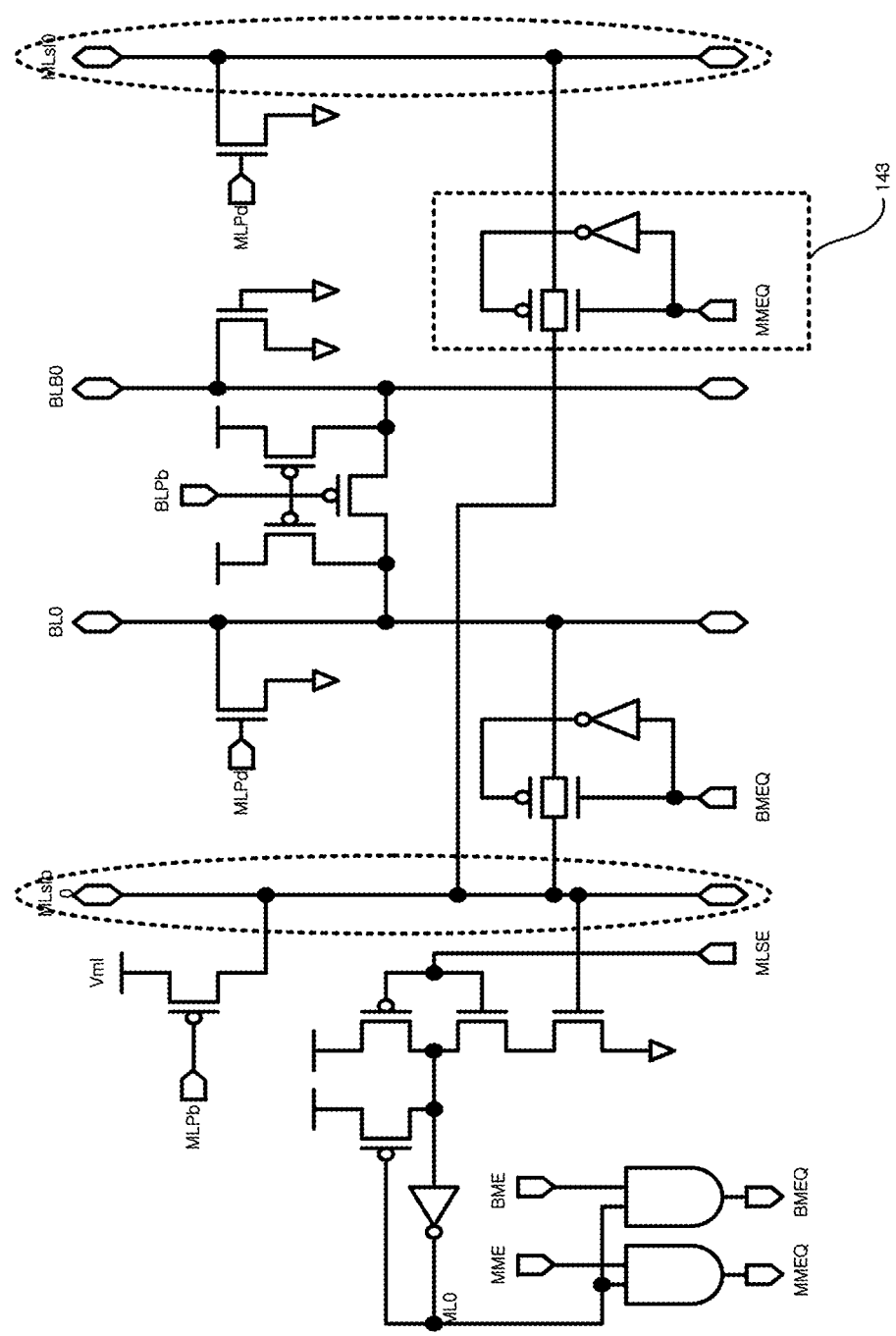
FIG. 15 is a circuit diagram showing an operation of a third step of the first phase.

FIGS. 12 to 16 are views showing an operation of the CAM device 100 of FIG. 6. In detail, FIG. 12 is a timing diagram showing the operation of the CAM device 100 of FIG. 6. FIGS. 13A and 13B are circuit diagrams showing an operation in a first step of the first phase. FIGS. 14A and 14B are circuit diagrams showing an operation of a second step of the first phase. FIG. 15 is a circuit diagram showing an operation of a third step of the first phase. FIGS. 16A and 16B are circuit diagrams showing an operation of the second phase.

Referring to FIGS. 12, 13A, and 13B, in the first step of the first phase, the signal MLPb is transited to a logic low level from a logic high level, and the signal MLPd is transited to a logic high level from a logic low level. Accordingly, the first match lines MLslb connected to the first half CAM cells are precharged to a voltage level V ml, and the bit line BL and the second match line MLsl are discharged.

Referring to FIGS. 12, 14a, and 14b, in the step S20 of the first phase, the SLBE signal is transited to a logic high level from a logic low level, and the evaluation operation is performed on the first match line MLslb. When all the search data and the data of the CAM cell are matched, the discharge path of the first match line MLslb is blocked, and thus, the voltage level of the first match line MLslb is maintained. When any of the search data and the data of the CAM cell is mismatched, the first match line MLslb is discharged. In this case, as the number of the mismatched data increases, the first match line MLslb is quickly discharged. Then, a single-ended sensing amplifier 142_1 of the sensing unit 142 senses the voltage level of the first match line MLslb and outputs the sensed result to the outside.

Referring to FIGS. 12 and 15, in the step S30 of the first phase, the signal MMEQ is transited to a logic high level from a logic low level. Accordingly, the first match line MLslb is electrically connected to the second match line MLsl. In this case, since the charges in the first match line MLslb are maintained and the mismatched first match line MLslb is discharged, the charge sharing operation is available between the matched first match line MLslb and the second match line MLsl. For example, each of the matched first match line MLslb and the second match line MLsl has a voltage level of 0.5×V ml. In other words, the second match line MLsl is precharged to the voltage level of 0.5×V ml due to the voltage sharing effect.

Figure 16A:
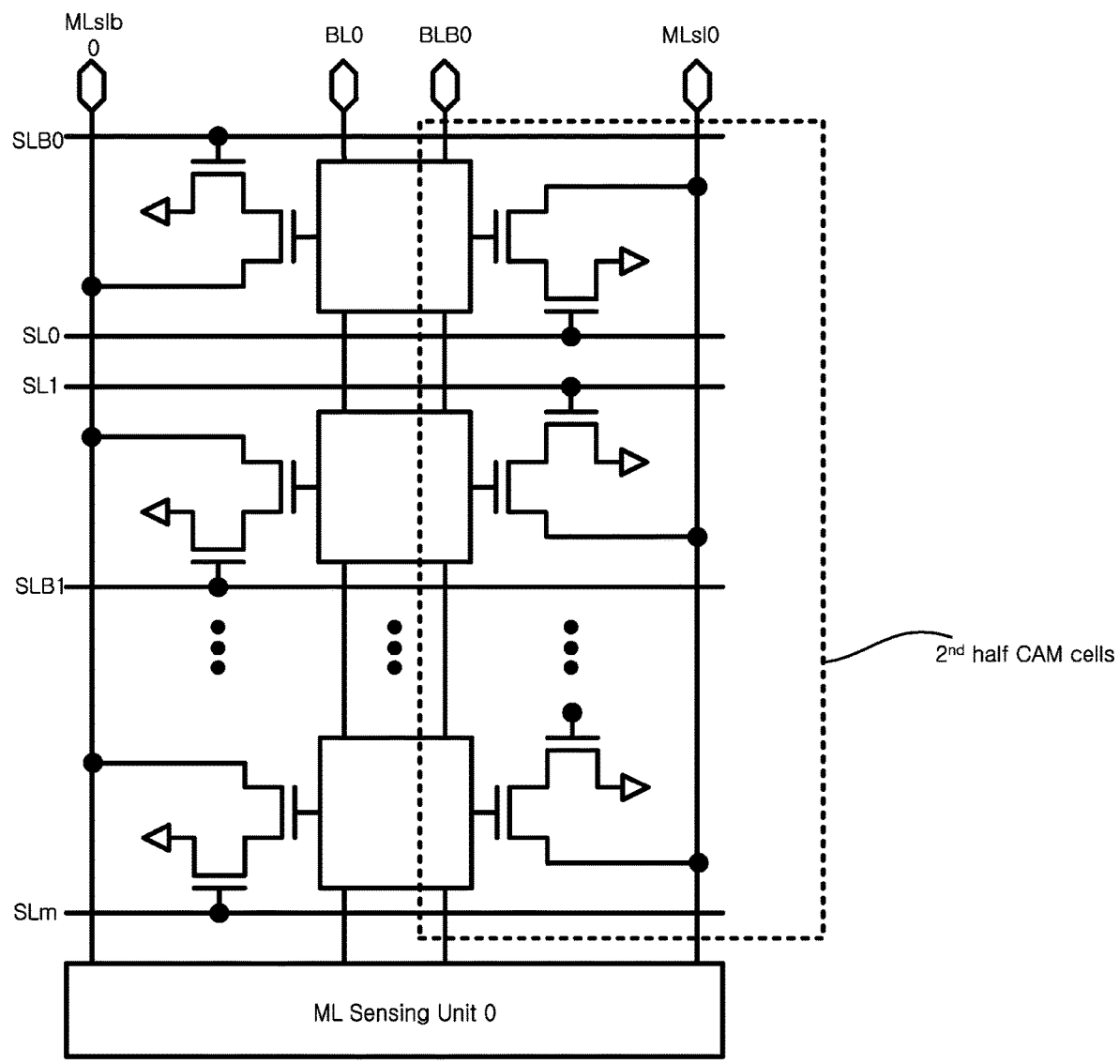
FIGS. 16A and 16B are circuit diagrams showing an operation of a second phase.
Figure 16B:
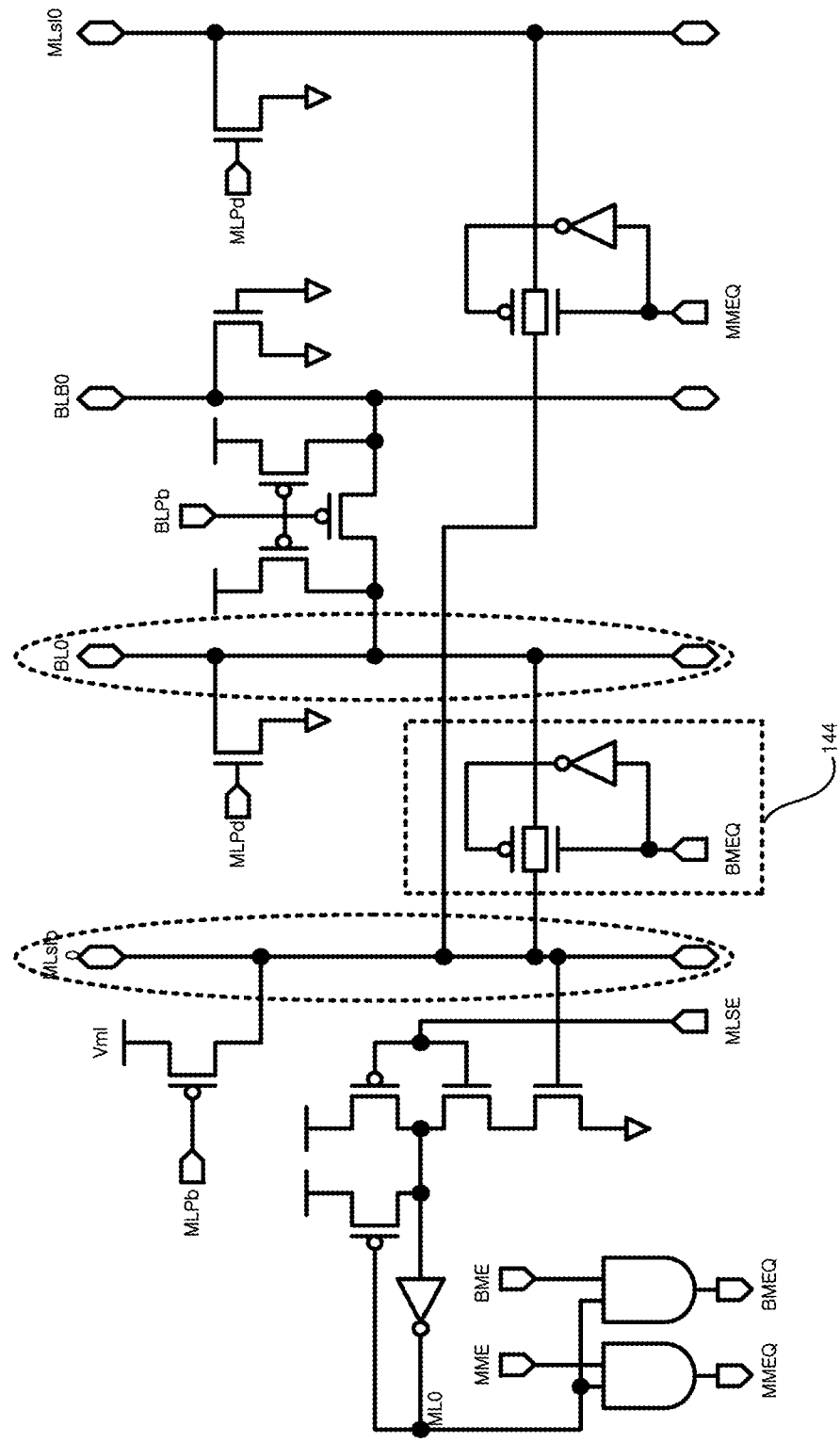

Referring to FIGS. 12, 16A, and 16B, in the second phase, the SLE signal is transited to a logic high level from a logic low level. Accordingly, the search data are provided in parallel to the search lines, and the evaluation operation is performed on the second match lines MLsl connected to the second half CAM cells depending on whether the data are matched.

Meanwhile, the signal BMEQ is transited to a logic high level from a logic low level in the second phase. Accordingly, the first match line MLslb is electrically connected to the bit line BL, and the charge sharing operation is performed between the first match line MLslb and the bit line BL. Since the voltage level of the matched first match line MLslb is maintained at about 0.5×V ml, each of the first match line MLslb and the bit line BL has a voltage level of about 0.25×V ml, after the charge sharing operation is performed. In this case, the voltage level (i.e., about 0.25×V ml) of the bit line BL is in between a voltage level (i.e., Vss) of the second match line MLsl that is discharged and the voltage level (i.e., about 0.5×V ml) of the second match line MLsl that is not discharged. Therefore, the voltage level of the bit line BL may be used as a reference voltage of the sensing amplifier to sense the voltage level of the second match line MLsl.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. A content addressable memory (CAM) device comprising:
   a cell array comprising a plurality of CAM cells;
   a search line driving circuit connected to the cell array through a plurality of search lines; and
   a match line sensing circuit connected to the cell array through a plurality of match lines, each of the CAM cells comprising:
   a first half CAM cell connected to a first match line;
   a second half CAM cell connected to a second match line different from the first match line; and
   a latch shared by the first and second half CAM cells and configured to store data,
   wherein the first match line connected to the first half CAM cell is precharged in a first phase, and the second match line connected to the second half CAM cell is precharged in a second phase after the first phase.

2. The CAM device of claim 1, wherein the first half CAM cell and the second half CAM cell respectively comprise three NMOS transistors connected to the latch that stores data.

3. The CAM device of claim 1, wherein the match line sensing circuit comprises:
a precharge unit configured to precharge the first match line; and
a charge sharing unit connected between the first match line and the second match line, and configured to perform a charge sharing operation between the first match line and the second match line after a sensing operation is performed on the first match line.

4. The CAM device of claim 3, wherein data of the CAM cells connected to the first match line are mismatched with search data corresponding to the first match line.

5. The CAM device of claim 1, wherein the match line sensing circuit comprises:
a precharge unit configured to precharge the first match line;
a first charge sharing unit configured to electrically connect the first match line with the second match line in the first phase; and
a second charge sharing unit configured to electrically the first match line with a bit line in the second phase.

6. The CAM device of claim 5, wherein the match line sensing circuit further comprises a sensing unit electrically connected to the first match line and the second match line and configured to perform a first sensing operation on the first match line and a second sensing operation on the second match line.

7. The CAM device of claim 6, wherein the bit line is connected to the first half CAM cell,
wherein the first charge sharing unit is configured to perform a first charge sharing operation between the first match line and the second match line after the first sensing operation is performed, and
wherein the second charge sharing unit is configured to perform a second charge sharing operation between the first match line and the bit line after the second sensing operation is performed.

8. The CAM device of claim 7, wherein the second sensing operation is performed after the first sensing operation is performed.

9. The CAM device of claim 7, wherein a voltage level of the bit line after the second charge sharing operation is performed is smaller than a voltage level of the first match line after the first charge sharing operation is performed.

10. The CAM device of claim 5, wherein the precharge unit comprises:
a first transistor connected to the first match line and configured to precharge the first match line in response to a first control signal; and
a second transistor connected to the second match line and configured to discharge the second match line in response to a second control signal different from the first control signal.

11. The CAM device of claim 1, further comprising a search data input circuit connected to the search line driving circuit and configured to transmit search data applied thereto from an outside to the search line driving circuit through a transmission line.

12. The CAM device of claim 1, wherein each of the first half CAM cell and the second half CAM cell is a NAND type CAM cell.

13. A content addressable memory (CAM) device, comprising:
a cell array comprising a plurality of CAM cells, each CAM cell comprising:
a first half CAM cell connected to a first match line; and
a second half CAM cell connected to a second match line different from the first match line;
a search line driving circuit connected to the cell array through a plurality of search lines; and
a match line sensing circuit connected to the cell array through a plurality of match lines and comprising:
a precharge unit configured to precharge the first match line in a first phase;
a first charge sharing unit configured to electrically connect the first match line with the second match line in the first phase; and
a second charge sharing unit configured to electrically connect the first match line with a bit line in a second phase after the first phase.

14. The CAM device of claim 13, wherein each of the CAM cells further comprises a latch configured to store data and shared by the first half CAM cell and the second half CAM cell.

15. The CAM device of claim 13, wherein each of the first half CAM cell and the second half CAM cell comprises a latch configured to store data and MOS transistors connected to the latch.

* * * * *